DIODE AND GATE HAVING INTEGRATOR DIFFERENTIATOR
EFFECTING LOGIC FUNCTION

Filed Aug. 29, 1960

INVENTOR.
EDUARDO A. BIANCHI
BY Daniel D. Sharp
ATTORNEY

United States Patent Office 3,128,394

Patented Apr. 7, 1964

3,128,394

DIODE AND GATE HAVING INTEGRATOR DIFFERENTIATOR EFFECTING LOGIC FUNCTION

Eduardo A. Bianchi, Rochester, N.Y., assignor to General Dynamics Corporation, Rochester, N.Y., a corporation of Delaware Filed Aug. 29, 1960, Ser. No. 52,396
6 Claims. (Cl. 307—88.5)

This invention relates to a logic circuit and more particularly to an AND gate adapted to derive an output pulse during the simultaneous presence of two input pulses of opposite polarity.

In many types of electronic equipment, such as self-testing of bistable trip units in process control channels, it is desirable to obtain a negative-going output signal which is the logic AND of a negative-going signal, such as a differentiated negative pulse from a bistable trip unit, and a positive-going signal, such as a relatively wide gating pulse. Normally, such AND logic is accomplished by means of a vacuum tube or transistor inverter in one of the input signal terminals followed by conventional diode AND gate using two separate diodes. The inverter is necessary in order that the two inputs to the diode AND gate be of the same polarity.

In accordance with this invention, the above-mentioned logic is achieved by a circuit which, except for a single solid-state diode, consists only of resistors and capacitors; this circuit is relatively simple and inexpensive and eliminates the normal requirement for an inverter and an additional diode. Since several such logic circuits may be required in electronic equipment, a substantial saving of components and space may be obtained by employing the circuit according to the invention.

Figure 1:
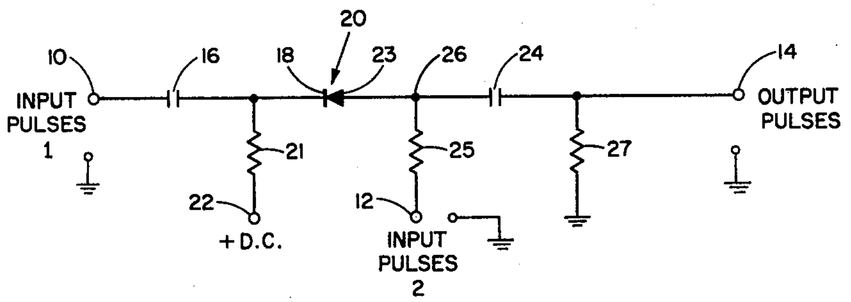
Figure 2:
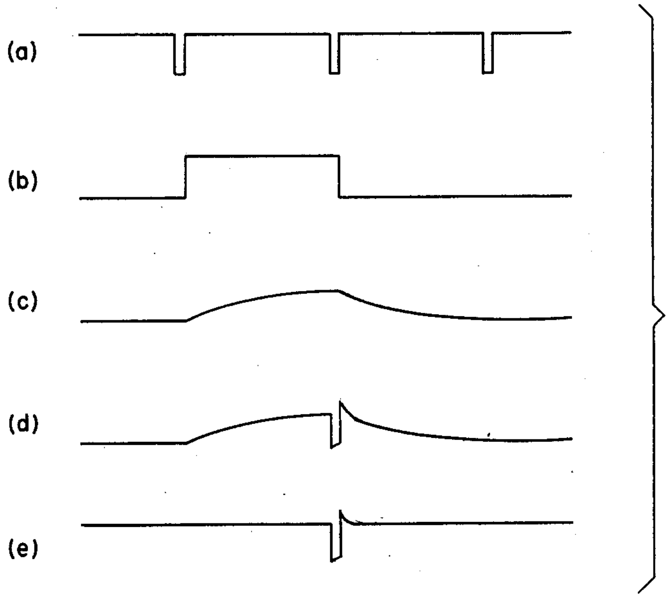

The invention now will be described in detail with reference to the accompanying drawing wherein:

FIG. 1 is a circuit diagram of a logic AND circuit in accordance with the invention; and FIG. 2 shows waveforms explanatory of the operation of the circuit of FIG. 1.

Referring now to FIG. 1, a logic AND circuit is provided with a first input terminal 10, a second input terminal 12, and an output terminal 14. The input terminal 10 is connected by way of a coupling capacitor 16 to the cathode 18 of a unilateral device, such as a semiconductor diode 20. A resistor 21 is inserted between the positive terminal 22 of a direct current supply voltage source and the cathode 18 of diode 20. The anode 23 of diode 20 is coupled through a capacitor 24 to output terminal 14.

The resistor 25, whose magnitude may be of the order of ten times that of resistor 21, is interposed between the negative terminal 12 and the junction of the anode 23 of diode 20 and one terminal of capacitor 24. Finally, a resistor 27, which may be of the order of one hundred times smaller than resistor 25, is connected to a point 26 common to the other terminal of capacitor 24 and the output terminal 14.

A train of negative input pulses, such as shown in FIG. 2($a$) and also referred to as a first input signal, is applied at input terminal 10. These pulses normally are narrow pulses which, for example, may be of the order of ten microseconds wide occurring every hundred milliseconds. These input pulses at terminal 10 are coupled to diode 20 by way of coupling capacitor 16. The direct current level of the input signal at terminal 10 is shifted to make its base line voltage about equal to the peak value of an input signal applied at terminal 12 by means of the positive direct current voltage connected to supply terminal 22. The direct current voltage level of the first input pulse is shifted in order to insure reverse bias on diode 20 in the absence of second input pulses at terminal 12. The time constant of the coupling network 16, 21 is relatively long compared with the duration of the pulse at terminal 10. The input signal at terminal 12, also referred to as a second input signal, may consist of a train of relatively wide positive pulses about 100 milliseconds wide occurring at one second intervals, such as shown in FIG. 2($b$).

The diode 20 is reverse biased by the positive voltage on the cathode 18 from terminal 22 when the input signal at terminal 12 and, hence, the voltage on anode 23, is more negative than the peak voltage of the first input signal at terminal 10. Consequently, any input signal available at terminal 10 is unable to pass through diode 20 to the output terminal 14 during the absence of an input signal at terminal 12.

In order to avoid an appreciable output signal at output terminal 14 when input signals are available only at terminal 12, a combination of a low-pass filter and a high-pass filter is employed. Although any type of a low-pass filter or a high-pass filter may be used, the circuit of FIG. 1 illustrates a simple combination of an RC integrator and an RC differentiator. Input signals at terminal 12 are integrated by a series circuit including resistor 25, capacitor 24 and resistor 27. Since the resistance of resistor 25 is of the order of magnitude of one hundred times that of resistor 27, resistor 27 may be neglected so far as the integrating circuit is concerned; that is, the effective integrating circuit consists of resistor 25 in series with capacitor 24. The integrated input signal, shown in FIG. 2($c$), as represented by the voltage across capacitor 24, that is, the voltage at point 26 relative to ground, then is applied to a differentiating circuit which includes capacitor 24 and resistor 27. The differentiating circuit has a short time constant compared with that of the integrating circuit just described. The output across resistor 27 represents the differential of the integrated waveform shown in FIG. 2($c$) which occurs at point 26. The result of differentiating the slowly changing integrated output waveform of FIG. 2($c$), when no input signals are available at terminal 10, is a waveform of low amplitude.

Whenever input pulses are available at terminal 10 concurrently with input pulses at terminal 12, diode 20 is forward biased and the input pulses at terminal 10 then pass through diode 20 and appear at point 26. The input pulses from terminal 10 thus are superimposed upon the integrated input pulses from terminal 12, as indicated in FIG. 2($d$). Now, the short pulses from terminal 10 appearing with the integrated waveform at point 26 are differentiated in the differentiating circuit 24, 27 and sharp negative pulses are derived at output terminal 14, as indicated in FIG. 2($e$). The two sets of input pulses may be synchronized, if desired, so that an input pulse from terminal 12 commences coincident with the termination of one of the input pulses from terminal 10 and ends coincident with the termination of a succeeding input pulse from terminal 10, as shown in FIG. 2. The invention, however, is not limited to this relationship between the two sets of input pulses; the only requirement is that the input pulses at terminal 10 occur during the presence of the wider gating pulses at terminal 12.

Although the device has been described so far as having short negative pulses applied at terminal 10 and longer positive pulses applied at terminal 12, the device is capable of operation with short positive pulses at terminal 10 and long negative pulses at terminal 12. In this case, the voltage applied at terminal 22 would be negative and the diode connections would be reversed. The output pulses at output terminal 14 would then be positive.

While there has been shown and described a specific embodiment of the invention, other modifications will readily occur to those skilled in the art. It is not, therefore, desired that this invention be limited to the specific arrangement shown and described, and it is intended in the appended claims to cover all modifications within the spirit and scope of the invention.

What is claimed is:

1. A logic AND circuit comprising first input terminal means adapted to receive first input pulses of one polarity, second input terminal means for receiving second input pulses of the opposite polarity, said first input pulses being of relatively short duration compared with said second input pulses, a unilateral impedance device coupled to said first and second input terminal means and positioned between said first and second input terminal means, said device blocking passage therethrough of said first pulses during the absence of said second pulses and presenting a low impedance to the passage of said first pulses whenever said second pulses are available, integrating means for integrating available second input pulses and receptive of available first input pulses for providing a composite waveform made up of integrated second input pulses upon which are superimposed said first input pulses, and differentiating means operating upon said composite waveform to provide output pulses of appreciable magnitude only in response to the superimposed first input pulses.

2. A logic AND circuit comprising first input terminal means adapted to receive first input pulses of one polarity, second input terminal means for receiving second input pulses of opposite polarity, a unilateral impedance device positioned between said first and second input terminal means, said device being coupled to said first and second terminal means and biased in accordance with the condition existing at said second input terminal means for blocking passage of said first pulses only during the absence of said second pulses, integrating means for integrating available second pulses and receptive of available first input pulses passed by said impedance device to provide a composite waveform made up of integrated second input pulses upon which are superimposed said first input pulses, and differentiating means operating upon said composite waveform for differentiating the integrated second pulses and available first pulses passing through said impedance device, said differentiating means producing output pulses of appreciable magnitude only during the period of said first input pulses, said differentiating means including a portion of said integrating means.

3. A logic AND circuit comprising first and second input terminal means and output terminal means, said first and second input terminal means being receptive of respective first and second input pulses of opposite polarity, said first input pulses being of relatively short duration compared with said second input pulses, a diode interposed between said first input terminal means and said output terminal means, said diode having one electrode connected to said first input terminal means and the other electrode connected to said second input terminal means by way of a first resistor, said diode being rendered conductive in response to second input pulses and rendered non-conductive in the absence of said second input pulses, wave-shaping means including a high-pass filter and a low-pass filter disposed between said second input terminal means and said output terminal means, said high-pass filter including a capacitor connected to said output terminal means and said first resistor, said low-pass filter including said capacitor and a second resistor connected to said output terminal means, said wave-shaping means inhibiting substantially the transfer of energy from said second input terminal means to said output terminal means during the absence of said first input pulses, said high-pass filter operating upon said first input pulses transmitted through said device for producing output pulses of substantial value at said output terminal means only during time coincidence of said first and second input pulses.

4. A passive logic AND gate comprising first input terminal means adapted to receive first input pulses of one polarity, second input terminal means for receiving second input pulses of opposite polarity, output terminal means, an impedance device interposed between said first terminal means and said output terminal means presenting a high impedance to the passage of said first pulses during the absence of said second pulses, means connected to one electrode of said impedance device for shifting the direct current level of said first input pulses to a base line value substantially equal to the peak value of said second input pulses, a first resistor connected between the other electrode of said impedance device and said second terminal means, a capacitor connected to the junction of said other electrode and said first resistor and in series with said first resistor, a second resistor connected in series with said capacitor and in shunt with said output terminal means, said second resistor being small in comparison with said first resistor, said first resistor and said capacitor forming an integrating circuit having a time constant small compared with the spacing between said first input pulses for integrating available second input pulses, said capacitor and said second resistor forming a differentiating circuit the time constant of which is small in comparison with that of said integrating circuit, said impedance device providing for passage of available first input pulses to said differentiating circuit during the presence of second input pulses, said differentiating circuit operating upon said applied first input pulses for producing output pulses of substantial magnitude at said output terminal only during the simultaneous occurrence of said first and said second input pulses.

5. A logic AND gate comprising first input terminal means adapted to receive first input pulses of one polarity, second input terminal means for receiving second input pulses of opposite polarity, output terminal means, a first resistor, a capacitor and a second resistor forming a series circuit across which available second pulses are applied, said first resistor and said capacitor forming an integrating circuit, said capacitor and said second resistor forming a differentiating circuit the time constant of which is small compared with that of said integrating circuit, an impedance device inserted between said first input terminal means and said differentiating circuit and coupled by way of said first resistor to said second input terminal means, said impedance device presenting a high impedance during the absence of said second pulses and constituting a low impedance for permitting passage of available first input pulses to said differentiating circuit only in response to available second input pulses, said differentiating circuit operating upon available first input pulses passed by said impedance device and upon integrated second input pulses to provide output pulses of substantial magnitude at said output terminal means only during simultaneous occurrence of said first and second input pulses.

6. A logic AND gate as set forth in claim 5 wherein the resistance of said second resistor is small in comparison with that of said first resistor.

References Cited in the file of this patent

UNITED STATES PATENTS

| | | |
|---|---|---|
| 2,730,632 | Curtis | Jan. 10, 1956 |
| 2,752,530 | Aigrain | June 26, 1956 |
| 2,817,772 | Lee | Dec. 24, 1957 |
| 2,823,307 | Freas et al. | Feb. 11, 1958 |

OTHER REFERENCES

IRE Dictionary of Electronic Terms and Symbols, published by I.R.E., New York, 1961.